United States Patent [19]

Brandman

[11] Patent Number: 4,609,830
[45] Date of Patent: Sep. 2, 1986

[54] PROGRAMMABLE LOGIC GATE

[75] Inventor: Yigal Brandman, Stanford, Calif.

[73] Assignee: Zoran Corporation, Santa Clara, Calif.

[21] Appl. No.: 555,899

[22] Filed: Nov. 28, 1983

[51] Int. Cl.[4] .................. H03K 19/02; H03K 19/094; H03K 19/173; H03K 19/20

[52] U.S. Cl. .................. 307/202.1; 307/451; 307/469

[58] Field of Search .............. 307/202.1, 451, 465, 307/468, 469; 365/200; 340/825.83, 825.84

[56] References Cited

U.S. PATENT DOCUMENTS

| | | | |
|---|---|---|---|
| 4,140,924 | 2/1979 | Oguey et al. | 307/469 X |
| 4,157,480 | 6/1979 | Edwards | 307/465 |
| 4,399,372 | 8/1983 | Tanimoto et al. | 307/279 |
| 4,424,456 | 1/1984 | Shiraki et al. | 307/451 X |
| 4,495,427 | 1/1985 | Cartwright, Jr. | 307/469 |
| 4,546,455 | 10/1985 | Iwahashi et al. | 365/200 |

Primary Examiner—Larry N. Anagnos
Attorney, Agent, or Firm—Flehr, Hohbach, Test, Albritton & Herbert

[57] ABSTRACT

A programmable logic gate includes first and second complementary field effect transistors having gate terminals connected to receive a first input signal. A first variable resistance is connected in series with the first transistor, and a second variable resistance is connected in parallel with the second transistor. The variable resistances can be fusible links or variable resistance semiconductor devices. By increasing the resistance of the first variable resistance and decreasing the resistance of the second variable resistance, the input signal becomes ineffective in the logic gate. Conversely, by decreasing the resistance of the first variable resistance and increasing the resistance of the second variable resistance, the input signal becomes effective in operation of the logic circuit. In programming the transistors, one transistor is effectively disconnected from the gate and the complementary transistor is effectively shorted.

6 Claims, 4 Drawing Figures

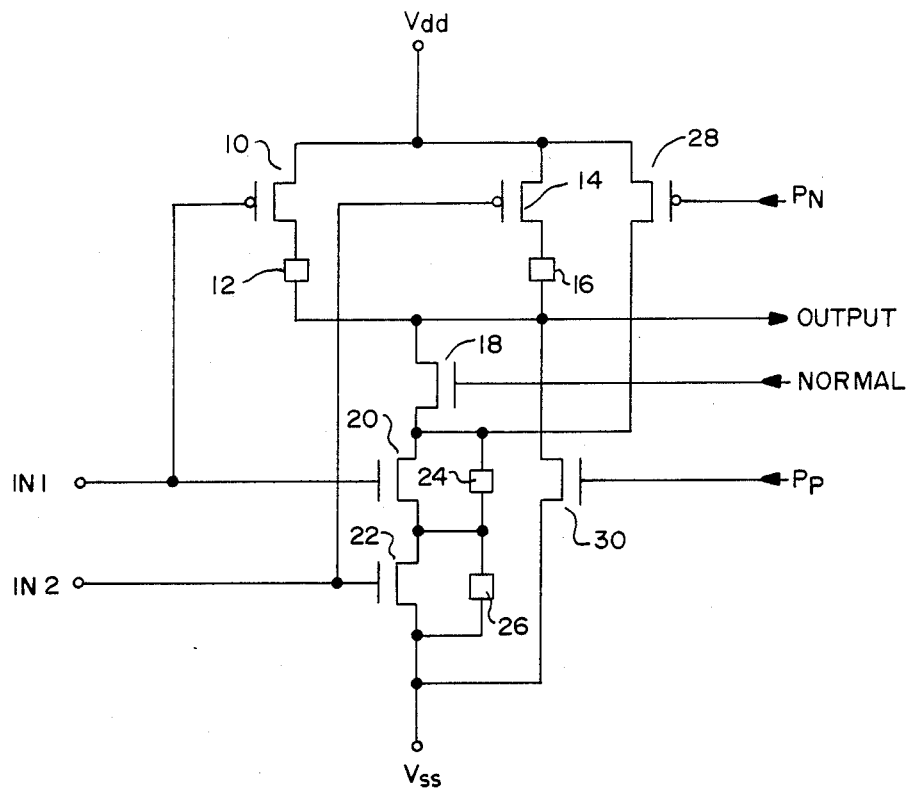
FIG. — 1
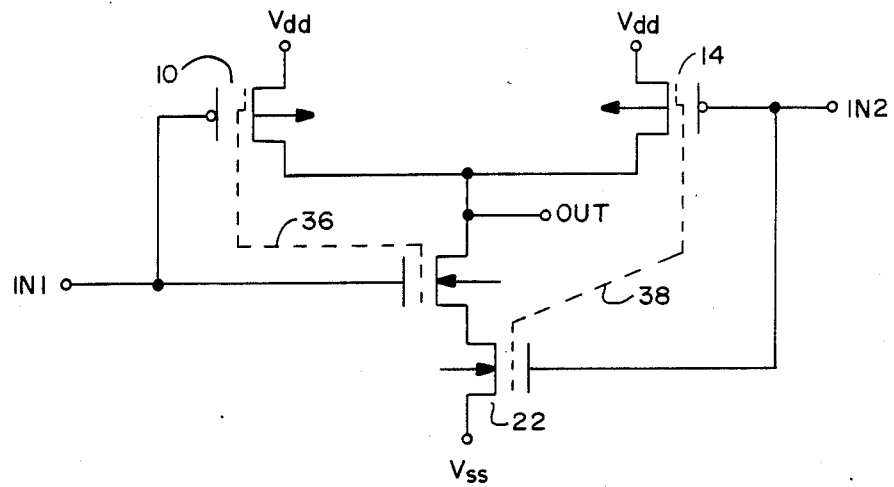
FIG. — 2

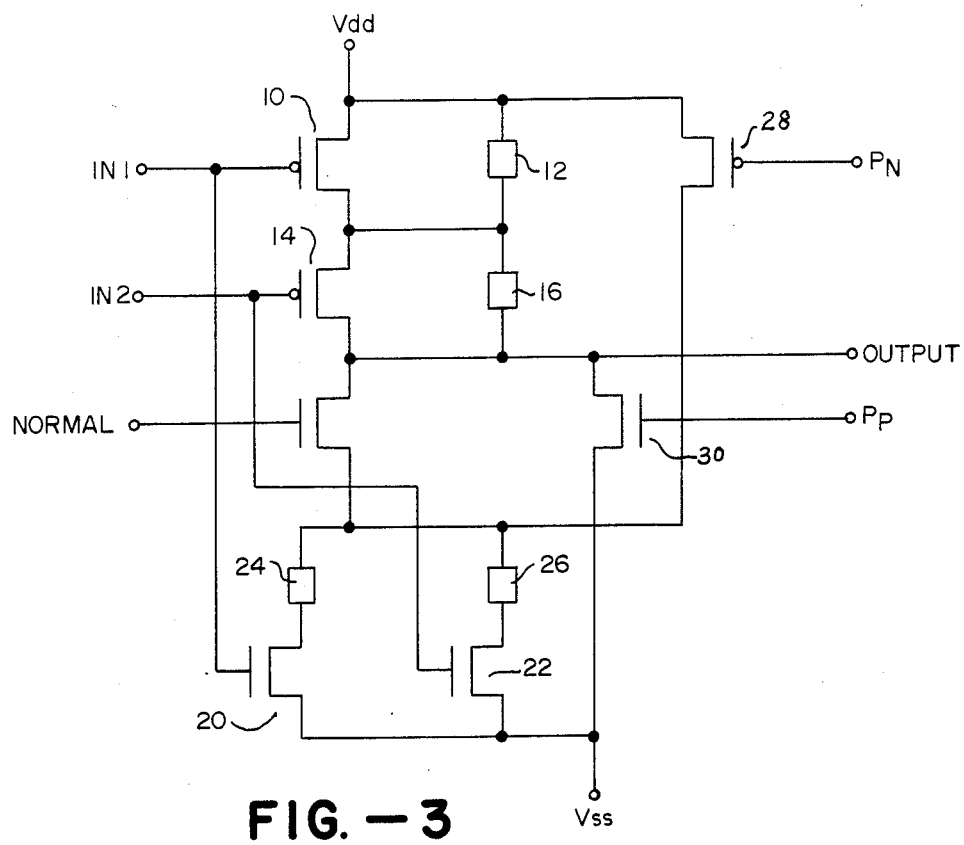
FIG.—3
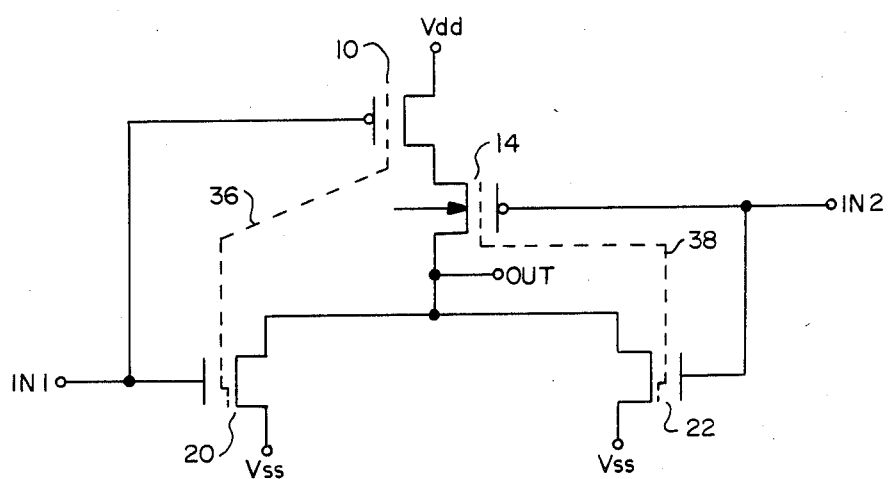
FIG.—4

4,609,830

PROGRAMMABLE LOGIC GATE

This invention relates generally to semiconductor devices and technology, and more particularly the invention relates to programmable transistors and logic gate structures.

The ability to program elements in a semiconductor integrated circuit, after fabrication thereof, is desirable in many applications including programmable memories, logic arrays, linear circuits, discretionary wiring in large integrated circuit arrays, and the like.

Copending application Ser. No. 451,823 for "Method and Structure for Selectively Interconnecting Electrical Circuit Elements", discloses a structure and method of programming which uses a predictable and selectable programming voltage. The disclosed variable resistance device utilizes a highly conductive semiconductor material having a contact surface characterized by high resistance formed by crystal lattice disruptions or by amorphotizing the surface layer. By applying sufficient voltage across the contact surface or sufficient current through the contact surface, the crystalline structure can be offered to vary the conductance thereof.

In accordance with the present invention complementary transistor pairs are provided in a logic gate and are selectively shorted and disconnected, respectively, to program the gate. Switch devices can be provided with individual transistors whereby the transistors can be selectively connected and disconnected in the electrical circuit. In a preferred embodiment, a plurality of transistors or variable resistances are interconnected in a gate array whereby selected inputs to the gate can be made ineffective.

The variable resistances can be fusible links or reversible programming devices such as disclosed in copending application Ser. No. 451,823, supra. In accordance with another embodiment of the invention complementary transistor pairs are provided with a common floating gate whereby the transistors can be selectively programmed as described in copending application Ser. No. 555,898, filed Nov. 28, 1983.

The invention and objects and features thereof will be more readily apparent from the following detailed description and appended claims when taken with the drawing, in which:

FIG. 1 and FIG. 2 are a functional block diagram of a NAND gate in accordance with embodiments of the present invention.

FIG. 3 and FIG. 4 are schematic diagrams of NOR gates in accordance with embodiments of the present invention.

Referring now to the drawings, FIG. 1 is an electrical schematic of a NAND gate in accordance with one embodiment of the invention. The gate comprises a first transistor 10 serially connected with a variable resistance device 12, and a second transistor 14 which is serially connected with a variable resistance device 16. Transistors 10 and 14 along with the serially connected resistors 12 and 16 are connected in parallel between a voltage potential, $V_{dd}$, and an output terminal. Serially connected between the output terminal and circuit ground are transistors 18 (for programming), 20, and 22. Transistors 20 and 22 are complementary with respect to transistors 10 and 14. Shunting transistor 20 is a variable resistance device 24, and shunting transistor 22 is a variable resistor device 26. The variable resistance devices can be fusible links or devices as disclosed in copending application Ser. No. 451,823, supra. First and second inputs are connected to the gates of transistors 20 and 22, respectively.

A programming transistor 28 is connected between $V_{dd}$ and the serially connected transistors 20, 22. A complementary programming transistor 30 is connected between the output terminal and circuit ground. In one embodiment the transistors 10, 14, and 28 are P channel devices whereas transistors 20, 22, 30, and 18 are N channel devices.

Either or both of the inputs can be part of the operating gate structure. For example, to include the IN 1 input in the gate, resistor 12 is shorted and resistor 24 is a high resistance. Similarly, to include the IN 2 input in the gate, resistor 16 is shorted and resistor 26 is a high resistance.

Programming transistors 28 and 30 are serially connected between $V_{dd}$ and $V_{ss}$ for use in programming the resistor elements 12, 16, 24, and 26. Transistor 30 is made conductive during the programming of resistors 12 and 16, and transistor 28 is made conductive during the programming of transistors 24 and 26.

Assuming the output = IN 1 is desired, then the programming sequence is:

| IN1 | IN2 | NORMAL | PP | PN | NOTE |
|-----|-----|--------|----|----|------|
| 0 | 1 | 0 | 1 | 1 | 12 is getting short |
| 1 | 0 | 0 | 0 | 0 | 26 is getting short |
| x | x | 1 | 0 | 1 | Normal operation is resumed |

During programming Vcc should be high (12 V), and during normal periods Vcc is low (5 V).

FIG. 2 is a schematic of a NAND gate similar to FIG. 1 but in which complementary transistor pairs sharing a common floating gate are employed, as disclosed in copending application Ser. No. 555,898, supra. Like elements have the same reference numberals. In this embodiment, complementary transistors 10 and 20 share a common floating gate 36, and the complementary transistors 14 and 22 share a common floating gate 38. The charge on the floating gates can be biased to render selective transistors conductive or non-conductive during the normal operating input voltages to the gate structure. Thus, an input to the gate structure can be eliminated by suitable biasing of the floating gates of the transistors associated with that input. Biasing of the floating gate is disclosed in the copending application Ser. No. 555,898.

FIG. 3 is an electrical schematic of a NOR gate in which the elements of FIG. 1 are reconnected with transistors 10 and 14 connected in series and transistors 20 and 22 connected in parallel. Again, the transistors 28 and 30 are employed for programming of the resistive elements 12, 16, 24, and 26.

Assuming that the output equal $\overline{IN1}$ is desired then the programming sequence will be:

| IN1 | IN2 | NORMAL | PP | PN | NOTE |
|-----|-----|--------|----|----|------|
| 0 | 1 | 0 | 1 | 1 | 16 is getting short |
| 1 | 0 | 0 | 0 | 0 | 24 is getting short |
| x | x | 1 | 0 | 1 | Normal operation is resumed |

FIG. 4 is a schematic of a NOR gate similar to that of FIG. 3 but in which complementary pairs of transistors sharing a common floating gate are employed. In this embodiment, complementary transistors 10 and 20 have a shared floating gate 36, and the complementary transistors 14 and 22 have the shared floating gate 38. Programming of the gate structure for activating a selected input is in accordance with the teachings of copending application Ser. No. 555,898, supra, referenced above.

It will be appreciated that a gate structure can have additional inputs by providing additional pairs of transistors and that one or more inputs can be activated or deactivated in the gate structure as described above. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A logic gate comprising
   a first P channel field effect transistor and a first variable resistance device connected in parallel,
   a second P channel field effect transistor and a second variable resistance device connected in parallel,
   a third N channel field effect transistor and a third variable resistance device serially connected,
   a fourth N channel field effect transistor and a fourth variable resistance device serially connected,
   means connecting the series connection of said third field effect transistor and third variable resistance device in parallel with the series connection of said fourth field effect transistor and said fourth variable resistance device thereby forming parallel circuitry,
   means serially connecting the parallel connection of said first field effect transistor and first variable resistance device, the parallel connecting of said second field effect transistor and second variable resistance device, and said parallel circuitry between first and second voltage potentials,
   means for applying a first input to said first and third field effect transistors,
   means for applying a second input to said second and fourth field effect transistors,
   means for obtaining an output at the connection between the parallel connection of said second field effect transistor with said second variable resistance device and said parallel circuitry in response to said first and second inputs,
   said first, second, third, and fourth variable resistance devices having a high resistance state and a low resistance state for selectively enabling said first input and said second input, and
   means for selectively applying sufficient current through said first, second, third, and fourth variable resistance devices to thereby alter the resistances of said variable resistance devices.

2. The logic gate as defined by claim 1 wherein said resistance devices comprise fusible links.

3. The logic gate as defined by claim 1 wherein said resistance devices comprise doped polycrystalline semiconductor material.

4. A logic gate comprising
   a first P channel field effect transistor and a first variable resistance device connected in series,
   a second P channel field effect transistor and a second variable resistance device connected in series,
   a third N channel field effect transistor and a third variable resistance device serially connected in parallel,
   a fourth N channel field effect transistor and a fourth variable resistance device connected in parallel,
   means connecting the series connection of said first field effect transistor and said first variable resistance device in parallel with the series connection of said second field effect transistor and said second variable resistance device thereby forming parallel circuitry,
   means serially connecting the parallel connection of said third field effect transistor and third variable resistance device, the parallel connection of said fourth field effect transistor and fourth variable resistance device, and said parallel circuitry between first and second voltage potentials,
   means for applying a first input to said first and third field effect transistors,
   means for applying a second input to said second and fourth field effect transistors,
   means for obtaining an output at the connection between the parallel connection of said third field effect transistor with the third variable resistance device and said parallel circuitry in response to said first and second inputs,
   said first, second, third, and fourth variable resistance devices having a high resistance state and a low resistance state for selectively enabling said first input and said second input, and
   means for selectively applying sufficient current through said first, second, third, and fourth variable resistance devices to thereby alter the resistance of said variable resistance devices.

5. The logic gate as defined by claim 4 wherein said resistance devices comprise fusible links.

6. The logic gate as defined by claim 4 wherein said resistance devices comprise doped polycrystalline semiconductor material.

* * * * *